United States Patent
Slonim et al.

(10) Patent No.: US 7,299,439 B1
(45) Date of Patent: Nov. 20, 2007

(54) ASSIGNMENT OF I/O OBJECTS WITH MULTIPLE I/O STANDARDS TO VIRTUAL I/O BANKS USING INTEGER LINEAR PROGRAMMING

(75) Inventors: Victor Z. Slonim, Broomfield, CO (US); Salim Abid, Lafayette, CO (US)

(73) Assignee: Xilinx, Inc., San Jose, CA (US)

( * ) Notice: Subject to any disclaimer, the term of this patent is extended or adjusted under 35 U.S.C. 154(b) by 271 days.

(21) Appl. No.: 11/135,980

(22) Filed: May 24, 2005

(51) Int. Cl.
*G06F 17/50* (2006.01)
(52) U.S. Cl. .......................................... 716/10; 716/16
(58) Field of Classification Search ............ 703/18–19; 716/5, 7–11, 16–18
See application file for complete search history.

(56) References Cited

U.S. PATENT DOCUMENTS

| | | | |
|---|---|---|---|
| 6,868,374 B1 * | 3/2005 | Ditlow et al. .................. | 703/18 |
| 7,111,265 B1 * | 9/2006 | Tan et al. ...................... | 716/10 |
| 7,203,916 B2 * | 4/2007 | Dotson et al. ................. | 716/5 |

OTHER PUBLICATIONS

Xilinx, Inc.; *Virtex-4 User Guide*; Chapter 6 "SelectIO Resources"; v.1.3, Apr. 11, 2005; available from Xilinx, Inc., 2100 Logic Drive, San Jose, California 95124; pp. 215-230.

Xilinx, Inc.; *Virtex-4 User Guide*; Chapter 6 "SelectIO Resources"; v.1.1, Sep. 10. 2004; available from Xilinx, Inc., 2100 Logic Drive, San Jose, California 95124; pp. 207-220.

Jason Anderson et al.; "A Placement Algorithm for FPGA Designs with Multiple I/O Standards"; Springer Verlag, Berlin, 2000; Proceedings of the 10th International Conference on Field-Programmable Logic and Applications; Lecture Notes in Computer Science 1896 (R.W. Hartenstein and H. Grunbacher, eds.); pp. 211-220.

Wai-Kei Mak; "Optimal I/O Placement for FPGAs with Multiple I/O Standards"; Feb. 2004; IEEE Transactions on Computer-Aided Design of Integrated Circuits and Systems; vol. 23(2); pp. 1-12.

\* cited by examiner

*Primary Examiner*—Paul Dinh
(74) *Attorney, Agent, or Firm*—Kevin T. Cuenot; Michael R. Hardaway

(57) ABSTRACT

A method of input/output (I/O) assignment for a circuit design for a programmable logic device (PLD) can include determining I/O types for I/O objects specified by the circuit design, defining a plurality of virtual I/O bank-groups, wherein each virtual I/O bank-group includes at least one virtual I/O bank, and binding I/O objects of the circuit design into I/O groups according to the I/O types. A binary compatibility matrix can be created. The binary compatibility matrix can indicate the compatibility between the virtual I/O bank-groups and the I/O groups based upon the I/O types of I/O objects within each I/O group. A determination can be made as to whether a feasible solution exists for I/O assignment of the I/O objects of the circuit design according to a plurality of constraints and the binary compatibility matrix.

20 Claims, 1 Drawing Sheet

ASSIGNMENT OF I/O OBJECTS WITH MULTIPLE I/O STANDARDS TO VIRTUAL I/O BANKS USING INTEGER LINEAR PROGRAMMING

BACKGROUND

1. Field of the Invention

This invention relates to the field of integrated circuits and, more particularly, to the assignment of input/output objects to input/output banks of an integrated circuit.

2. Description of the Related Art

Modern programmable logic devices (PLDs), such as field programmable gate arrays (FPGAs), are capable of supporting a variety of different input/output (I/O) standards. Examples of I/O standards can include, but are not limited to, different varieties of Gunning Transceiver Logic (GTL) signaling such as GTL, GTL_DCI, and GTLP_DCI, Low Voltage Differential Signaling LVDS25, LVCMOS25, and the like. Each of these I/O standards specifies a set of attributes such as whether a reference voltage $V_{REF}$ is necessary, the value of any required $V_{REF}$, whether a voltage supply $V_{CC}$ is needed for input ($V_{CCI}$) or output ($V_{CCO}$), and/or the value of any required $V_{CCI}$ or $V_{CCO}$. This listing of I/O standards and attributes is not intended to be exhaustive, but rather illustrative of the many varieties of I/O standards and corresponding attributes.

Most modern PLDs organize I/O objects of a circuit design into a limited number of physical I/O banks on the PLD. A PLD can include approximately 8 I/O banks, although this number is not definitive of every type of PLD as different PLDs can include varying numbers of I/O banks. In any case, each I/O bank can be associated with a plurality of different I/O objects. The I/O objects that are assigned to a given I/O bank must be configured according to compatible I/O standards. As such, the placement of I/O objects into a given I/O bank can be said to be constrained by the organization of that I/O bank.

In illustration, some I/O standards require a specific $V_{CCI}$ or $V_{CCO}$. An I/O bank typically has a single $V_{CC}$ supply. Accordingly, only I/O objects configured according to I/O standards that have compatible $V_{CC}$ requirements can be assigned to the same I/O bank. Other attributes of I/O standards serve to further restrict the field of I/O banks to which a given I/O object can be assigned.

The task of assigning I/O objects to I/O banks is commonly referred to as the "Select I/O placement problem". Conventional solutions for Select I/O placement divide the problem into two different phases. The first phase attempts to find a non-optimal, legal solution that satisfies all non-Select I/O related constraints concerning I/O placement. The second phase seeks to improve the solution to achieve placement legality with regard to the Select I/O constraints.

Past techniques for solving the select I/O placement problem have relied upon heuristics to automate I/O placement. One heuristic-based approach utilizes a combination of simulated annealing, bipartite matching, and constructive bin-packing to find a solution. Heuristic-based techniques, however, do have disadvantages. In particular, heuristic-driven techniques are not guaranteed to determine a feasible I/O placement solution despite the existence of a solution. Further, heuristic techniques are not capable of identifying an inherently infeasible circuit design.

Another proposed solution for the I/O placement problem relies upon an Integer Linear Programming (ILP) formulation of the problem. This solution seeks to overcome the uncertainties inherent to heuristic approaches discussed above. The ILP model includes provisions for addressing voltage constraints when assigning I/O objects to physical I/O banks. Other attributes of I/O standards, however, are not addressed. Specifically, the ILP model lacks any mechanism for dealing with special termination types. Reformulating, or expanding, the ILP model to accommodate such additional attributes is extremely difficult.

It would be beneficial to perform I/O placement in a manner which overcomes the limitations described above.

SUMMARY OF THE INVENTION

The present invention provides a solution for evaluating the feasibility of a circuit design with respect to input/output (I/O) assignment. One embodiment of the present invention can include a method of I/O assignment for a circuit design for a programmable logic device (PLD). The method can include determining I/O types for I/O objects specified by the circuit design and defining a plurality of virtual I/O bank-groups, where each virtual I/O bank-group comprises at least one virtual I/O bank. I/O objects of the circuit design can be bound into I/O groups according to the I/O types. The method further can include creating a binary compatibility matrix indicating compatibility between the virtual I/O bank-groups and the I/O groups based upon the I/O types.

The method also can include determining whether a feasible solution exists for assignment of the I/O objects of the circuit design according to a plurality of constraints and the binary compatibility matrix. The step of determining whether a feasible solution exists can include calculating the number of virtual I/O banks needed for the solution and, if the number of virtual I/O banks does not exceed the number of physical I/O banks of the PLD, determining that the solution is feasible. An objective function can be formulated which minimizes the total number of virtual I/O banks needed by the circuit design.

The step of determining whether a feasible solution exists also can include calculating a number of virtual I/O banks needed by the circuit design based upon a plurality of constraints using an Integer Linear Programming technique. The I/O type can depend upon a standard I/O type and a maximum capacity of a physical I/O bank having the standard I/O type. The I/O type also can specify an I/O standard having a particular termination type, such that the binary compatibility matrix indicates compatibility among different I/O standards.

The plurality of constraints can include a resource constraint indicating that a sum of all I/O objects of a selected I/O type assigned to all virtual I/O bank-groups is equal to a total number of I/O objects in the I/O group of the selected I/O type. The plurality of constraints further can include a capacity constraint indicating that for a virtual I/O bank-group of a particular I/O type, a capacity of the virtual I/O bank-group is not less than a total number of I/O objects assigned to the virtual I/O bank-group.

Another embodiment of the present invention can include a method of determining a solution for I/O assignment for a circuit design for a PLD. The method can include identifying a set of relationships among a plurality of I/O objects of the circuit design. The set of relationships can be dependent upon an I/O standard of each of the plurality of I/O objects. The set of relationships further can include at least one capacity constraint which indicates a number of I/O objects that can be assigned to a selected, physical I/O bank of the PLD based upon pin requirements of I/O standards of the I/O objects assigned thereto.

A binary compatibility matrix can be created based upon the set of relationships. The binary compatibility matrix can indicate the compatibility among different ones of the plurality of I/O objects of the circuit design that correspond to different I/O standards.

The method further can include determining an assignment of I/O objects of the circuit design to a plurality of virtual I/O bank-groups. Each virtual I/O bank-group can include one or more virtual I/O banks. Each virtual I/O bank can be mapped to a physical I/O bank of the PLD. The determining step can include first solving an Integer Linear Programming problem defined by the set of relationships. The number of virtual I/O banks used can be calculated. If the number of virtual I/O banks exceeds the number of physical I/O banks of the PLD, a determination can be made that the I/O assignment solution is not feasible.

Another embodiment of the present invention can include a method of assigning I/O objects of a circuit design to physical I/O banks of a PLD. The method can include formulating a plurality of constraints regulating placement of I/O objects of varying I/O standards to physical I/O banks of the PLD.

In one embodiment, the plurality of constraints can depend upon I/O types. The I/O types, denoted as Tk, can be defined as Tk={Sk, Ck}, where Sk represents an I/O standard of type k, and where Ck represents a maximum capacity of a physical I/O bank of the programmable logic device that is assigned I/O objects of type Sk. The plurality of constraints also can depend upon virtual I/O bank-groups. Each virtual I/O bank-group can be denoted as B of type k and can be defined as Bk={Yk, Tk}, where Yk represents a total number of virtual I/O banks that support a same I/O type Tk. The plurality of constraints also can depend upon I/O groups. I/O groups can be denoted as Gi and can be defined as Gi={Ni, Ti}, where Ni is the total number of I/O objects that have the same I/O type Ti, and i=1 to M, where M is the total number of I/O types specified by the circuit design.

The method further can include creating a binary compatibility matrix which indicates compatibility among the I/O objects of varying I/O standards. An Integer Linear Programming problem can be defined which depends upon the plurality of constraints and the binary compatibility matrix. The defining step can include specifying a resource constraint as $$\sum_{k=1}^{M} Xik = Ni,$$

where Xik is a number of I/O objects from an I/O group Gi that is assigned to a virtual I/O bank-group Bk, and Ni is a total number of I/O objects of the I/O group Gi. A capacity constraint also can be specified. The capacity constraint can be specified as $$\sum_{i=1}^{M} AikXik \leq CkYk,$$

where Aik is an element of the binary compatibility matrix and is a binary value indicating compatibility between an I/O group Gi and a virtual I/O bank-group Bk.

The total number of virtual I/O banks can be denoted as Nvb and can be defined as $$Nvb = \sum_{k=1}^{M} Yk.$$

Accordingly, the Integer Linear Programming problem can include an objective function denoted as F, where F=min (Nvb). The Integer Linear Programming problem can be solved to determine whether a feasible solution exists for assignment of the I/O objects of the circuit design. One or more values for Yk can be calculated.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE INVENTION

Figure 1:
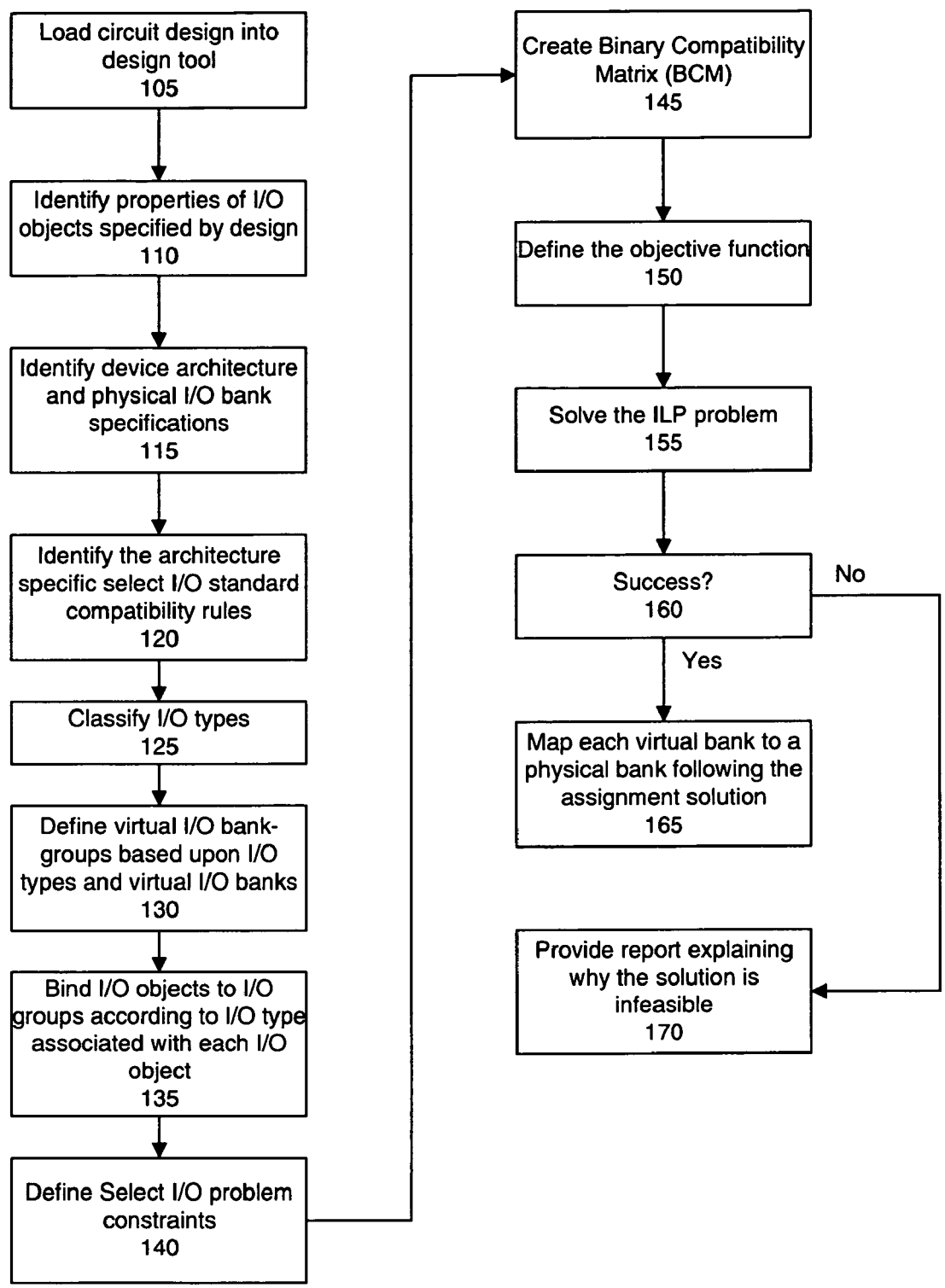
FIG. 1 is a flow chart illustrating a method of determining the feasibility of I/O placement in relation to a circuit design for a PLD in accordance with the inventive arrangements disclosed herein.

The present invention provides a technique for assigning input/output (I/O) objects to I/O banks of an integrated circuit (IC), such as a programmable logic device (PLD) or other IC having programmable logic, while observing constraints relating to I/O standards of the I/O objects assigned to each I/O bank. More particularly, the present invention can determine whether a problem instance, in reference to a circuit design for a PLD, is feasible with respect to the Select I/O placement problem. If so, a feasible I/O placement can be determined.

In determining the feasibility of a given design and/or I/O placement solution, attributes of the various I/O objects, as defined by the I/O standard of each I/O object, can be taken into consideration. Compatibility rules, or constraints, relating to the placement of I/O objects can be observed. These constraints can relate to the placement of I/O objects within a same I/O bank given differences in voltage requirements, I/O object termination types, and I/O bank capacities.

In accordance with the inventive arrangements disclosed herein, I/O objects can be organized into groups based upon the I/O standard of each I/O object. Virtual I/O bank-group constructs are used to which I/O objects also can be assigned. The use of I/O groups and virtual I/O bank-groups serves to reduce the complexity of the select I/O problem from one that depends upon the number of I/O blocks in a design to one that depends upon the number of I/O standards. The present invention provides a solution that virtually is independent of the number of I/O objects within a design.

FIG. 1 is a flow chart illustrating a method of determining the feasibility of I/O placement in relation to a design for a PLD in accordance with the inventive arrangements disclosed herein. In one embodiment, the steps described herein can be implemented within a software-based design tool executing within a suitable information processing system. As known, such design tools can operate upon netlists or other software-based representations of circuit designs.

Thus, in step 105, a design for an integrated circuit, or a portion thereof, can be loaded into a design tool. While the design can be for any of a variety of different PLDs, in one embodiment, the design can be for a field programmable gate array (FPGA).

In step 110, the properties of any I/O objects specified by the design can be identified. As used herein, an I/O object can refer to an I/O instance, such as an I/O block (IOB) in a given design. The attributes of an I/O object can refer to those parameters that are dictated by the particular I/O standard to which the I/O object is to conform. Examples of common I/O standards can include, but are not limited to, LVCMOS25, LVDS25, PCI33_3, GTL, GTL_DCI, GTLP_DCI, HSTL_I_D, LVDCI_18, and LVDCI_33. This listing is not intended to be exhaustive, but rather serve as an illustration of the many different I/O standards that are available.

Each of the aforementioned I/O standards specifies a variety of different attributes. An I/O object configured in accordance with one of the I/O standards must posses the attributes associated with that I/O standard. In illustration, some I/O standards require the use of a differential amplifier, which in turn requires an external voltage reference of $V_{REF}$. Typically, a voltage of $V_{REF}$ is needed for the input objects of such standards but not for the output objects. Other I/O standards require a specific supply voltage, $V_{CC}$, to power the input blocks and/or output blocks. Often an input supply voltage $V_{CCI}$ and an output supply voltage $V_{CCO}$ are specified separately as some standards require a $V_{CCO}$ for output blocks but no $V_{CCI}$ for input blocks. Bi-directional I/O objects of an I/O standard have the combined requirements of the input objects and the output objects for that standard. Typically, I/O objects can be configured as input, output, or bi-directional type. Some newer I/O standards have special source termination types such as driver, split, and single.

When assigning I/O objects to an I/O bank, the I/O standards to which each I/O object within the I/O bank is configured must not conflict with one another. In illustration, two I/O blocks, each requiring a different supply voltage, would not be compatible with one another. As such, the two I/O objects could not be assigned to a same I/O bank. To do so would violate design constraints.

In step 115, the device architecture of the PLD to be loaded with the design is identified. The specification relating to the physical I/O banks of the device can be identified. Any features of the device relating to the physical I/O banks can be noted. These features can include, but are not limited to, the number of physical I/O banks on the device, the number of IOBs per physical I/O bank, as well as whether the I/O banks have any specialized, or reserved, pins. Reserved pins can include any pins which can be used to accommodate special I/O standards. Oftentimes, if not needed, reserved pins can be used to accommodate regular user I/O objects. Other features of physical I/O banks can include the number of voltage sources available per bank, the number of voltage references available per bank, as well as the value of the voltage sources and references available to each bank. Some I/O banks, however, do not include special pins for accommodating I/O objects of particular types. The capacity of such I/O banks would be 0 for I/O objects of those types.

In step 120, the select I/O standard compatibility rules specific to the hardware device architecture can be identified. These compatibility rules can specify how particular I/O pins of an I/O bank function and, further, alter the number of I/O pins available for use by the design in the I/O banks. In illustration, an I/O bank can include a predetermined number of I/O pins that are available to the user as inputs or outputs, i.e. regular user I/O pins, and other pins that are reserved for special uses as noted above. These pins can be referred to as $V_R$ pins. Examples of $V_R$ pins can include I/O pins reserved for voltage references or I/O objects having particular termination types. If none of the I/O objects assigned to a particular I/O bank require a voltage reference, I/O pins reserved for use with a voltage reference can be made available, or used, as regular user I/O pins. Similarly, if none of the I/O objects assigned to an I/O bank utilize a special termination type needing a dedicated $V_R$ pin, the $V_R$ pins also can be made available, or used, as regular user I/O pins. Accordingly, the rules for determining when the $V_R$ pins are needed in their reserved capacity or can function as regular user I/O objects can be determined. These rules can vary from one device architecture to another and can be defined in a device specification.

In step 125, different I/O types can be classified. The I/O types, denoted as Tk, can be dependent upon two parameters. The I/O types can be defined as $Tk=\{Sk, Ck\}$, where Sk represents the I/O standard having type k and Ck represents the physical I/O bank maximum capacity determined by Sk. The physical I/O bank maximum capacity Ck can be assumed to be the same for all I/O banks with respect to I/O objects of I/O standard Sk. The physical I/O bank maximum capacity can be determined from a review of the PLD specification. Generally, U can be defined as the default minimum I/O bank capacity which is equal to the total number of regular user I/O pins. Here, $V_{REF}$ can refer to the number of dedicated $V_{REF}$ pins per I/O bank and $V_R$ can refer to the number of dedicated pins for a particular termination type within a given physical I/O bank.

With these parameters in mind, bank capacity Ck can be defined based upon the PLD specification and the following observations. If an I/O bank of type k supports an I/O standard of type k that has a definitive $V_{REF}$ voltage and special termination type, the capacity of the I/O bank can be defined as Ck=U. If the I/O bank supports an I/O standard of type k that does not require $V_{REF}$ voltage, but requires a special termination type, then all dedicated $V_{REF}$ pins can be used as regular user I/O pins and the total I/O bank capacity can be defined as $Ck=U+V_{REF}$. If an I/O bank of type k supports an I/O standard of type k that requires $V_{REF}$ voltage, but does not require special termination types, all dedicated $V_R$ pins can be used as regular user I/O pins and the total bank capacity is $Ck=U+V_R$. If an I/O bank of type k supports an I/O standard of type k that does not require a $V_{REF}$ voltage or special termination type, all dedicated $V_{REF}$ and $V_R$ pins can be used as regular user I/O pins. In that case, the total bank capacity can be defined as $Ck=U+V_{REF}+V_R$.

Table 1 below provides a listing of different attributes specified for various I/O standards as well as the capacity Ck of each. The letters "NR", as used herein, stand for "not relevant" and indicate the ability of a given I/O standard to accommodate a variety of different values for a specified attribute.

TABLE 1

| I/O Standard Name | $V_{REF}$ (Volts) | $V_{CCO}$ (Volts) | $V_{CCO}$ (Volts) | Termination Type | Capacity |
|---|---|---|---|---|---|
| LVCMOS25 | NR | 2.5 | 2.5 | NR | $U + V_{REF} + V_R$ |
| LVDS25 | NR | NR | NR | NR | $U + V_{REF} + V_R$ |
| PCI33_3 | NR | 3.3 | 3.3 | NR | $U + V_{REF} + V_R$ |
| GTL | 0.8 | NR | NR | NR | $U + V_R$ |
| GTL_DCI | 0.8 | 1.2 | 1.2 | Single | U |
| GTLP_DCI | 1.0 | 1.5 | 1.5 | Single | U |

TABLE 1-continued

| I/O Standard Name | $V_{REF}$ (Volts) | $V_{CCO}$ (Volts) | $V_{CCO}$ (Volts) | Termination Type | Capacity |
|---|---|---|---|---|---|
| HSTL_I_D | 0.75 | 1.5 | 1.5 | Split | U |
| LVDCI_18 | NR | NR | 1.8 | Driver | $U + V_{REF}$ |
| LVDCI_33 | NR | NR | 3.3 | Driver | $U + V_{REF}$ |

To better illustrate, consider a design having 5 IOBs of I/O standard GTL_DCI, denoted as Sa, 40 IOBs of I/O standard GTLP_DCI, denoted as Sb, and 3 IOBs of I/O standard GTL, denoted as Sc. The device can include 4 physical I/O banks with a total capacity of 80 IOB sites. Each I/O bank can have a total capacity of 20 pins, with 17 regular pins, 2 pins reserved as $V_{REF}$ pins, and 1 pin reserved as a $V_R$ pin. While this example will be used throughout the specification to illustrate various aspects of the present invention, it should not be considered limiting as other examples could be used.

The I/O types would be defined as follows: Ta={Sa, Ca}, Tb={Sb, Cb}, and Tc={Sc, Cc}. As noted, Ck indicates the physical bank maximum capacity as determined by the I/O standard Sk. Thus, Ck can be determined as follows:

$Ca=20-1-2=17$ $Cb=20-1-2=17$ $Cc=20-2=18$

This results in the following I/O types:

Ta={GTL_DCI, 17}

Tb={GTLP_DCI, 17}

Tc={GTL, 18}

In step 130, virtual I/O bank-groups can be defined based upon the I/O types of step 125. I/O objects can be assigned to the virtual I/O bank-groups. A virtual I/O bank is software construct representing an I/O bank. A virtual I/O bank can share the same characteristics as a physical bank, but need not be mapped to a physical bank. Each virtual I/O bank-group, denoted as Bk, can be classified according to two parameters. The virtual I/O bank-groups can be defined as Bk={Yk, Tk}, where Yk, is the total number of virtual I/O banks that have the same I/O type Tk. Yk is an unknown and an independent variable to be found as described herein using Integer Linear Programming (ILP).

The virtual I/O bank-group constructs reduce the complexity of the Select I/O problem. To solve the Select I/O problem, the total number of all virtual I/O banks Yk defined by Tk and Bk can be larger than the actual I/O, or physical, banks of the PLD. Upon resolution of the select I/O problem, each virtual I/O bank can, but need not, have a corresponding physical I/O bank. Whether a virtual I/O bank has a corresponding physical bank depends upon the feasibility of the Select I/O problem. That is, a feasible solution has a number of virtual I/O banks that is less than or equal to the number of physical I/O banks of the PLD.

Continuing with the previous example, the virtual I/O bank-groups can be defined as follows:

Ba={Ya, Ta}

Bb={Yb, Tb}

Bc={Yc, Tc}

As noted, Yk represents the number of virtual I/O banks configured to support I/O objects of a given I/O type Tk.

In step 135, all of the I/O objects can be bound into I/O groups according to the I/O type associated with each I/O object. Each I/O group G of type i, where i=1, . . . , M, can be classified as a set of 2 parameters. In particular, I/O groups can be defined as Gi={Ni, Ti}, where Ni is the total number of I/O objects that have the same I/O type Ti and M is the total number of I/O types presented within the design. Each original I/O object is assigned to some I/O group Gi and the sum of all Ni gives the total number of I/O objects in the design.

With reference to the previous example, the groups can be defined as follows:

Ga={Na, Ta}, where Na=5 and Ta= {Sa, Ca}={GTL_DCI, 17}

Gb={Nb, Tb}, where Nb=40 and Tb= {Sb, Cb}={GTLP_DCI, 17}

Gc={Nc, Tc}, where Nc=3 and Tc= {Sc, Cc}={GTL, 18}

Thus,

Ga={5, GTL_DCI, 17}

Gb={40, GTLP_DCI, 17}

Gc={3, GTL, 18}

As can be seen from the above relationships, Ni represents the total number of I/O objects of the same type Ti.

Using the relationships defined above, a Select I/O problem with reduced complexity can be formulated in step 140. The reduced complexity assignment problem can be formulated as a mapping between I/O groups and virtual I/O bank-groups. This formulation includes an objective function and a set of inequalities which describe a complete set of constraints for the reduced complexity problem. Each of the constraints can be linear and all of the independent variables can be represented by non-negative integers. Accordingly, if the objective function is formulated in linear form, the problem can be formulated as an ILP problem that can be resolved using any of a variety of commercially available, software-based, ILP solvers.

The reduced complexity problem formulation is based upon several different qualitative constraints, which are as follows. All I/O objects of each I/O group can be distributed between compatible I/O banks. The number of I/O objects from an I/O group Gi that can be assigned to a virtual I/O bank Bk can be defined as Xik. Each Xik can represent one of the independent variables of the ILP formulation to be solved. The compatibility between I/O group Gi and I/O bank Bk is determined by a value of an element Aik that can be 1 or 0. All of the elements Aik, taken together, form a Binary Compatibility Matrix (BCM) to be described herein in greater detail. The BCM elements Aik can be computed according to compatibility rules between I/O types T. The elements Aik of the BCM are set equal to 1 for compatible types and 0 for incompatible types.

Additional constraints can specify that a sum of all I/O objects of a selected I/O type assigned to all virtual I/O bank-groups is equal to a total number of I/O objects in an I/O group of the selected I/O type. Each virtual I/O bank-group can accept I/O objects from different I/O groups in such a way that the total number of I/O objects in the virtual I/O bank-group is no larger than the virtual I/O bank-group capacity. While the assignment problem is always solvable given a large enough number of virtual I/O banks, a solution is feasible only if the total number of virtual I/O banks is less than or equal to the total number of physical I/O banks available within the PLD architecture being used.

Given these constraints, the assignment placement problem can be summarized quantitatively using resource, capacity, and compatibility constraints. Regarding resource constraints, of each I/O group of type i, where i=1, ..., M, the total number of I/O objects assigned to all virtual I/O banks can be determined from the design and can be denoted as Ni, where $$\sum_{k=1}^{M} Xik = Ni.$$

Continuing with the previous example, the following resource constraints can be determined:

Xaa+Xab+Xac=Na=5

Xba+Xbb+Xbc=Nb=40

Xca+Xcb+Xcc=Nc=3

Regarding capacity constraints, for each I/O bank of type k, where k=1, ..., M, the total capacity must not be less than the total number of all I/O objects assigned to the virtual I/O bank-group. The total virtual I/O bank-group capacity can be determined as a product of the number of virtual I/O banks with I/O type Tk to the maximum capacity of the physical I/O bank, assuming identical physical I/O banks, and can be represented as $$\sum_{i=1}^{M} AikXik \leq CkYk.$$

Referring again the example, the following capacity constraints can be defined:

AaaXaa+AbaXba+AcaXca≤YaCa=17*Ya

AabXab+AbbXbb+AcbXcb≤YbCb=17*Yb

AacXac+AbcXbc+AccXcc≤YcCc=18*Yc

Regarding compatibility constraints, I/O objects of an I/O standard type i can be assigned to a bank of type k only if the I/O types of the objects are compatible. In other words, only if Aik=1. This constraint significantly reduces the problem complexity as all variables Xik can be considered to be equal to 0 whenever the BCM element Aik is equal to 0. Finally, regarding integer and non-negativity constraints, Xik, where i=1, ..., M; k=1, ..., M, and Yk, where k=1, ..., M, should have non-negative integer values.

In step 145, the BCM can be created. The BCM can be formulated by observing the following rules pertaining to I/O standard compatibility. The voltages needed for $V_{REF}$ and $V_{CC}$ required by a given I/O standard must be compatible within the I/O bank. That is, all I/O objects assigned to a same I/O bank, must correspond to an I/O standard having the same fixed $V_{REF}$ and $V_{CC}$ requirements or to an I/O standard that has an undefined value, denoted as "NR" in Table 1.

In addition to $V_{REF}$ and $V_{CC}$ compatibility, the terminate type also must be compatible within the same I/O bank. The programming of an IOB, with respect to the input or output buffer, determines which terminate type to use with an I/O standard. IOBs programmed bi-directionally, which use both input and output buffers, use an I/O standard which allows for bi-directional programming. Only one I/O standard having a terminate type of single can be programmed per I/O bank. Only one I/O standard having a terminate type of split can be programmed per I/O bank. Terminate types of single and split can co-exist in a same I/O bank. Terminate types none and driver are not restricted to being the only terminate type within a given I/O bank. Thus, terminate types none and driver can co-exist with types split and single.

From the above-listed hardware constraints, it can be seen that the compatibility between I/O groups and virtual I/O bank-groups, as represented by the BCM elements, can be simplified if based upon the compatibility between the I/O types Ti and Tk. In general, two I/O types will be compatible if the I/O standard of each I/O type, Si and Sk, is the same. In other words, the two I/O types are compatible if index i is equal to index k. Alternatively, Ti and Tk are compatible if Si and Sk are compatible.

Using these rules, it can be seen that the group Gi is not compatible with the bank Bk if the following constraints are met. In other words, Aik=0, in the following cases. If I/O types Ti and Tk require different definite values for $V_{REF}$ and/or $V_{CC}$, then Aik=0. If I/O types Ti and Tk have different I/O standards and both require special termination types of single or split, then Aik=0.

For purposes of illustration, Table 2 below is an example of a BCM that has been derived based upon Table 1 in accordance with the inventive arrangements disclosed herein.

TABLE 2

|  | LVCMOS25 | LVDS25 | PCI33_3 | GTL | GTL_DCI | GTLP_DCI | HSTL_I_D | LVDCI_18 | LVDCI_33 |
| --- | --- | --- | --- | --- | --- | --- | --- | --- | --- |
| LVCMOS25 | 1 | 1 | 0 | 1 | 0 | 0 | 0 | 0 | 0 |
| LVDS25 | 1 | 1 | 0 | 1 | 0 | 0 | 0 | 0 | 0 |
| PCI33_3 | 0 | 0 | 1 | 1 | 0 | 0 | 0 | 0 | 1 |
| GTL | 1 | 1 | 1 | 1 | 1 | 0 | 0 | 0 | 1 |
| GTL_DCI | 0 | 0 | 0 | 1 | 1 | 0 | 0 | 0 | 0 |
| GTLP_DCI | 0 | 0 | 0 | 0 | 0 | 1 | 0 | 0 | 0 |
| HSTL_I_D | 0 | 0 | 0 | 0 | 0 | 0 | 1 | 0 | 0 |
| LVDCI_18 | 0 | 0 | 0 | 0 | 0 | 0 | 0 | 1 | 0 |
| LVDCI_33 | 0 | 0 | 1 | 1 | 0 | 0 | 0 | 0 | 1 |

Continuing with the example where a design has 5 IOBs of I/O standard GTL_DCI, 40 IOBs of I/O standard GTLP_DCI, and 3 IOBs of I/O standard GTL, Table 3 below illustrates the corresponding BCM.

TABLE 3

|    | Ga | Gb | Gc |
|----|----|----|----|
| Ga | 1  | 0  | 1  |
| Gb | 0  | 1  | 0  |
| Gc | 1  | 0  | 1  |

For purposes of illustration, and continuing with the example, the following compatibility constraints can be determined. From the BCM of Table 3, the following relationships can be determined: Aab=Aba=Abc=Aca=Acb=0, and accordingly, Xab=Xba=Xbc=Xcb=0. The prior discussed resource and capacity constraints can be rewritten and simplified using the relationships obtained from the BCM of Table 3.

In step 150, the objective function for solving the I/O assignment problem using ILP can be defined. The objective function is defined based upon the PLD specifications and, particularly, the number of physical I/O banks of the device. As noted, to achieve a feasible solution, the total number of virtual I/O banks must not exceed the number of physical I/O banks. The total number of virtual I/O banks can be defined as $$Nvb = \sum_{k=1}^{M} Yk.$$

Accordingly, the objective function, denoted as F, being defined as the minimization of the total number of virtual I/O banks, can be represented as F=min(Nvb).

In terms of solving the select I/O problem, all constraints can be satisfied if a sufficient number of virtual I/O banks is used. In illustration, one virtual I/O bank for each I/O standard can be used as well as multiple virtual I/O banks of type k which are necessary to accommodate objects of group type k. The solution of the select I/O problem, however is only feasible if the minimum number of virtual I/O banks does not exceed the number N of physical I/O banks available for a given PLD. Thus, continuing with the previous example, the following relationship for N can be defined:

$$Min(Ya+Yb+Yc) \leq N.$$

In step 155, the ILP problem can be solved. As noted, the ILP problem can be solved through the use of an ILP solver. Available ILP solvers can include, but are not limited to, LP_Solve, which is a free solver, and the solver available under the GNU Scientific Library. Other commercial solvers also are available. Again, referring to the example, the solver, or an analysis of the constraints set forth herein, can yield a unique, feasible solution where Ya=0, Yb=3, and Yc=1.

In step 160, a determination can be made as to whether a feasible solution was determined using the ILP solver. If so, the method can proceed to step 165. If not, the method can continue to step 170, where a report is provided which explains why the solution is infeasible. In step 165, where a feasible solution was determined, each virtual bank can be mapped to a physical bank following the assignment solution. Continuing with the example, it can be determined that:

Ga={5, Ta}, where Xaa=5, Xab=0, Xac=0, and
  Ba={1, Ta}

Gb={40, Tb}, where Xba=0, Xbb=40, Xbc=0, and
  Bb={3, Tb}

Gc={3, Tc}, where Xca=3, Xcb=0, Xcc=0, and
  Bc={0, Tc}

From the above relationships, it further can be determined that a solution is feasible where Gc is assigned to virtual I/O bank-group Ba, Gb is assigned to a virtual I/O bank-group Bb that includes 3 physical I/O banks, and Ga is merged with Gc to the virtual bank-group Ba. Subsequently, during the design process, the solution can be enforced as a set of one or more design constraints which can be observed by a placer.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program, software, application, or any variant thereof, in the present context, means any expression, in any language, code or notation, of a set of instructions intended to cause a system having an information processing capability to perform a particular function either directly or after either or both of the following: a) conversion to another language, code, or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A method of input/output (I/O) assignment for a circuit design comprising:

determining an I/O type for each I/O object specified by the circuit design;

defining a plurality of virtual I/O bank-groups, wherein each virtual I/O bank-group comprises at least one virtual I/O bank;

binding each I/O object of the circuit design into an I/O group according to the I/O type associated with the I/O object;

creating a binary compatibility matrix indicting compatibility between the virtual I/O bank-groups and the I/O groups based upon the I/O type of each I/O object; and determining whether a feasible solution exists for assignment of the I/O object according to a plurality of constraints and the binary compatibility matrix.

2. The method of claim 1, said step of determining whether a feasible solution exists further comprising:
calculating the number of virtual I/O banks needed for the solution; and
if the number of virtual I/O banks does not exceed the number of physical I/O banks of a programmable logic device, determining that the solution is feasible.

3. The method of claim 1, said step of determining whether a feasible solution exists further comprising formulating an objective function which minimizes the total number of virtual I/O banks needed by the circuit design.

4. The method of claim 1, wherein the I/O type depends upon a standard I/O type and a maximum capacity of a physical I/O bank having the standard I/O type.

5. The method of claim 1, said step of determining whether a feasible solution exists further comprising calculating a number of virtual I/O banks needed by the circuit design, based upon a plurality of constraints, using an Integer Linear Programming technique.

6. The method of claim 5, wherein the plurality of constraints comprise a resource constraint indicating that a sum of all I/O objects of a selected I/O type assigned to all virtual I/O bank-groups is equal to a total number of I/O objects in an I/O group of the selected I/O type.

7. The method of claim 5, wherein the plurality of constraints comprise a capacity constraint indicating that for a virtual I/O bank-group of a particular I/O type, a capacity of the virtual I/O bank-group is not less than a total number of I/O objects assigned to the virtual I/O bank-group.

8. The method of claim 1, wherein each I/O type specifies an I/O standard having a particular termination type, such that the binary compatibility matrix indicates compatibility among different I/O standards.

9. A method of determining a solution for input/output (I/O) assignment for a circuit design for a programmable logic device comprising:
identifying a set of relationships among a plurality of I/O objects of the circuit design, wherein the set of relationships is dependent upon an I/O standard of each of the plurality of I/O objects;
creating a binary compatibility matrix based upon the set of relationships, wherein the binary compatibility matrix indicates compatibility among different ones of the plurality of I/O objects of the circuit design that correspond to different I/O standards;
determining an assignment of I/O objects of the circuit design to a plurality of virtual I/O bank-groups, wherein each virtual I/O bank-group comprises at least one virtual I/O bank; and
mapping each virtual I/O bank to a physical I/O bank of the programmable logic device.

10. The method of claim 9, further comprising:
calculating a number of virtual I/O banks used; and
if the number of virtual I/O banks exceeds a number of physical I/O banks of the programmable logic device, determining that the I/O assignment solution is not feasible.

11. The method of claim 9, wherein the set of relationships comprises at least one capacity constraint which indicates a number of I/O objects that can be assigned to a selected, physical I/O bank of the programmable logic device based upon pin requirements of I/O standards of the I/O objects assigned thereto.

12. The method of claim 9, said determining step comprising first solving an Integer Linear Programming problem defined by the set of relationships.

13. A method of assigning input/output (I/O) objects of a circuit design to physical I/O banks of a programmable logic device comprising:
formulating a plurality of constraints regulating placement of I/O objects to physical I/O banks of the programmable logic device;
creating a binary compatibility matrix indicating compatibility among the I/O objects;
defining an Integer Linear Programming problem which depends upon the plurality of constraints and the binary compatibility matrix; and
solving the Integer Linear Programming problem to determine whether a feasible solution exists for assignment of the I/O objects of the circuit design.

14. The method of claim 13, wherein the plurality of constraints depend upon I/O types, wherein the I/O types, denoted as Tk, are defined as Tk={Sk, Ck}, where Sk represents an I/O standard of type k, and where Ck represents a maximum capacity of a physical I/O bank of the programmable logic device that is assigned I/O objects of type Sk.

15. The method of claim 14, wherein the plurality of constraints depend upon virtual I/O bank-groups, wherein the virtual I/O bank-groups, denoted as B of type k, are defined as Bk={Yk, Tk}, where Yk represents a total number of virtual I/O banks that have a same I/O type Tk.

16. The method of claim 15, wherein the plurality of constraints depend upon I/O groups, wherein the I/O groups, denoted as Gi, are defined as Gi={Ni, Ti}, where Ni is the total number of I/O objects that have the same I/O type Ti, and i=1 to M, where M is the total number of I/O types specified by the circuit design.

17. The method of claim 16, said defining step further comprising specifying a resource constraint as $$\sum_{k=1}^{M} Xik = Ni,$$

where Xik is a number of I/O objects from an I/O group Gi that is assigned to a virtual I/O bank-group Bk, and Ni is a total number of I/O objects of group Gi.

18. The method of claim 17, said defining step further comprising specifying a capacity constraint as $$\sum_{i=1}^{M} AikXik \le CkYk,$$

where Aik is an element of the binary compatibility matrix and is a binary value indicating compatibility between an I/O group Gi and a virtual I/O bank-group Bk.

19. The method of claim 18, wherein the total number of virtual I/O banks, denoted as Nvb, is defined as $$Nvb = \sum_{k=1}^{M} Yk,$$

and the Integer Linear Programming problem comprises an objective function, denoted as F, defined as F=min(Nvb).

20. The method of claim 19, said solving step comprising calculating at least one value for Yk.

* * * * *